United States Patent [19]
Nakasuji et al.

[11] Patent Number: 5,981,947
[45] Date of Patent: Nov. 9, 1999

[54] APPARATUS FOR DETECTING OR COLLECTING SECONDARY ELECTRONS, CHARGED-PARTICLE BEAM EXPOSURE APPARATUS COMPRISING SAME, AND RELATED METHODS

[75] Inventors: Mamoru Nakasuji, Yokohama; Teruaki Okino, Kamakura; Noriyuki Hirayanagi, Kawasaki, all of Japan

[73] Assignee: Nikon Corporation, Tokyo, Japan

[21] Appl. No.: 09/017,736

[22] Filed: Feb. 3, 1998

[51] Int. Cl.$^6$ .................................................. H01J 37/28
[52] U.S. Cl. ............................................ 250/310; 250/397
[58] Field of Search .................................. 250/310, 311, 250/397

[56] References Cited

U.S. PATENT DOCUMENTS

| | | | |
|---|---|---|---|
| 5,412,210 | 5/1995 | Todokoro et al. | 250/310 |
| 5,594,245 | 1/1997 | Todokoro et al. | 250/310 |
| 5,872,358 | 2/1999 | Todokoro et al. | 250/310 |

FOREIGN PATENT DOCUMENTS 5-290786 (A)   5/1993   Japan .

OTHER PUBLICATIONS

Kato et al., "A Beam Drift Reduction Device for the X-Ray Mask E-Beam Writer, EB-X2," *Jpn. J. Appl. Phys.* 35:6429–6434 (1996).

Kato et al., "Beam Position Stabilization by Suppression of Electrons Reentering the Electron-Beam Column," *J. Vac. Sci. Technol.* 13:2450–2454 (1995).

*Primary Examiner*—Edward P. Westin
*Assistant Examiner*—Nikita Wells
*Attorney, Agent, or Firm*—Klarquist Sparkman Campbell Leigh & Whinston, LLP

[57] ABSTRACT

Apparatus and methods are disclosed for performing highly precise mark detection by obtaining a large signal as a result of the efficient capture of secondary electrons (SEs) emitted from a surface of a specimen. A charged-particle beam is directed at a location (e.g., a mark) on the specimen (e.g., reticle or wafer). SEs emitted from the location are detected using one or more secondary-electron collectors or detectors. To guide the SEs toward the secondary-electron collectors or detectors, a magnetic flux is created that extends radially outward in the vicinity of the surface of the specimen. E.g., an objective lens is situated above the specimen adjacent the specimen surface, and an electromagnetic lens is placed below the specimen adjacent the lower surface of the specimen. The magnetic fields produced by these lenses can be mutually repulsive to form a resultant magnetic flux near the upper surface of the specimen that extends radially outward parallel with the upper surface of the specimen. Thus, electrons can escape only radially outward parallel to the sample surface to the secondary-electron collectors or detectors. The apparatus provides a stable charged-particle beam without charging because the SE collector or detector removes SEs from the vicinity of the optical axis.

55 Claims, 9 Drawing Sheets

APPARATUS FOR DETECTING OR COLLECTING SECONDARY ELECTRONS, CHARGED-PARTICLE BEAM EXPOSURE APPARATUS COMPRISING SAME, AND RELATED METHODS

FIELD OF THE INVENTION

This invention pertains to apparatus that irradiate an object with an electron beam or other charged-particle beam so as to produce secondary electrons ("SEs") that are collected and/or detected, and measured to produce an image. Such apparatus are used in scanning electron microscopes (SEMs) and steppers, the latter employing such apparatus for collecting SEs for detecting registration of alignment marks and the like before making and during a lithographic exposure.

BACKGROUND OF THE INVENTION

Traditionally, in the production of semiconductor integrated circuits and displays, a pattern as defined by a mask is exposed onto an area ("die") of a sensitive substrate (termed herein generally a "wafer"). Normally, multiple such exposures are made at each die on the wafer, each exposure being made using a different mask. Such multiple exposures place extreme demands on the ability of the apparatus to align the die and mask very accurately.

Alignment prior to exposure is normally achieved by scanning or otherwise irradiating an electron beam on a mark formed on the mask and/or on the surface of the wafer. Electrons in the beam (i.e., "primary electrons") that are reflected, scattered, and/or produced as secondary electrons ("SEs") propagating from the mark are detected to determine whether the mark(s) are properly aligned. For example, marks on the mask are conventionally detected by detecting electrons reflected from certain features of the mark when the electron beam strikes the mark. Marks as used on wafers normally comprise grooves each having walls and a bottom. When the electron beam strikes the mark, primary electrons that have penetrated into the wafer are scattered within the thickness dimension of the wafer. Scattered electrons that pass through the walls of the grooves provide strong detection signals. Electrons reflected from the bottoms of the grooves provide relatively weak detection signals since the trajectory of such electrons is impeded by the groove walls. Such signal differences are measured and analyzed to determine the relative position of the mark.

Mark detection by reflected electrons as described above tends to produce signals having low-contrast and poor resolution. First, the detector used in such schemes can detect only reflected electrons that propagate to an area within the field of view of the detector, which tends to be limited. Second, the electrons that reflect from the mark normally represent no more than about 50% of the primary electrons impinging upon the mark. Third, if the mark is relatively thin or otherwise has an elevation that is not much different from the surrounding surface, irradiating the mark with an electron beam having a high accelerating voltage results in little interaction between the primary electrons and the mark.

Scanning-type imaging apparatus such as scanning electron microscopes (SEMs) do not exploit reflected primary electrons as described above, but rather produce an image of a region on a specimen by detecting SEs generated by the interaction of irradiating primary electrons impinging upon the region. SEM techniques have been used for detecting alignment marks and other features (e.g., contact holes) on a wafer. For example, an electron beam having a high accelerating voltage is directed at the bottom of a contact hole. Electrons are reflected from the bottom of the hole and propagate upward at an angle through a resist layer on the surface of the wafer. SEs produced when the reflected electrons pass through the surface of the resist are detected. (See Japanese Laid-Open Patent Document no. 5-290786 (1993)).

Conventional image production by detecting SEs also poses problems. First, the primary-electron beam must be directed diagonally (i.e., at a substantial angle of incidence) at the specimen, which cannot be accomplished in lithographic apparatus in which the electron beam normally has a zero incidence angle relative to the mask and substrate. Second, an electrical field generated by the secondary-electron (SE) detector to attract SEs to the detector can adversely affect impingement of the primary electrons on the mark. These problems degrade detection accuracy and cause a decreased signal-to-noise (S/N) ratio. Another problem is that SEs around the optical axis generate beam instability caused by charging, as discussed in Kato et al., *Jpn. J. Appl. Phys.* 35:6429–6434 (1996).

SUMMARY OF THE INVENTION

In view of the foregoing shortcomings of conventional apparatus and methods, an object of the present invention is to provide a secondary-electron (SE) collection and/or detection apparatus having improved accuracy and contrast, with high signal-to-noise ratio and high stability. Other objects are to provide charged-particle-beam exposure apparatus and mark-detection apparatus comprising such improved SE collection and/or detection apparatus, and methods utilizing same.

The foregoing objects are met by any of various embodiments described below which represent the current best modes of the subject invention in its various aspects.

According to a first aspect of the invention, an apparatus is provided for collecting and/or detecting SEs from a specimen. The apparatus comprises a charged-particle-beam (CPB) optical system and at least one SE detector or SE collector. The CPB optical system is situated so as to direct a particle beam (e.g., an electron beam) to a location on a first surface of a specimen. The charged-particle beam has sufficient energy to produce SEs when the beam impinges on the location. The CPB optical system has an optical axis and comprises a first electromagnetic lens situated adjacent the first surface. The first electromagnetic lens produces a magnetic field defined by a magnetic flux. The apparatus also comprises any of various means for causing the magnetic flux to extend from the location radially outward relative to the optical axis. The radially extending magnetic flux serves to urge SEs produced at the location impinged by the charged-particle beam to propagate along the radially outward extending magnetic flux. The SE detector or collector (preferably more than one, e.g., two to eight, and preferably each being positively biased) is situated so as to detect or collect, respectively, SEs propagating along the radially outward extending magnetic flux.

With a configuration as described above, SEs propagating in a direction parallel to the optical axis away from the specimen are urged back toward the specimen (by the Miller effect) and then radially outward relative to the optical axis.

The first electromagnetic lens is preferably radially symmetrical (e.g., cylindrical or conical) about the optical axis. The optical axis, in turn, can be perpendicular to the first surface of the specimen at the location struck by the charged-particle beam, wherein the charged-particle beam is directed along the optical axis to the location. An exemplary first electromagnetic lens is an objective lens.

The means for causing the magnetic flux to extend from the location radially outward relative to the optical axis can be a magnet (e.g., a permanent magnet, electromagnet, or second electromagnetic lens). The magnetic flux produced by such means can be oriented so as to be repulsive to the magnetic flux generated by the first electromagnetic lens, which urges the resultant flux to bend sharply from the axis to a radially outward extending direction such that the flux extends radially outward parallel to the first surface of the specimen. The magnet is preferably radially symmetrical about the optical axis. If an electromagnet or second electromagnetic lens is employed, a controller is preferably used to control, inter alia, the amount of electrical energy applied to the electromagnet. Alternatively, the magnet can be attached to an actuator for moving the magnet axially relative to the specimen. Either approach provides a way in which to adjust the magnetic-flux strength produced by the magnet and the manner in which the two magnetic fluxes interact with each other.

The apparatus can include a specimen stage that is pivotable or tiltable about an axis perpendicular to the optical axis to allow optical orientation of the specimen relative to the charged-particle beam.

The apparatus can include a deflector for deflecting the charged-particle beam in any of various directions relative to the optical axis so as to scan the charged-particle beam over region of the first surface including the location.

As stated above, the apparatus can comprise multiple SE collectors and/or SE detectors, preferably placed radially symmetrically relative to the optical axis. Especially if SE detectors are used, each of the SE detectors can be connected to a selector switch to permit selection of specific SE detectors from which to obtain an electrical signal exhibiting a parameter that is proportional to an aspect of the SEs detected by the SE detectors. The SE detectors and/or SE collectors are preferably connected to a processor that is operable to produce, e.g., an image-forming signal or other signal from the data obtained from the SE detector(s) and/or SE collector(s). An appropriate display can be connected to the processor for producing a display corresponding to the image-forming signal.

Rather than or in addition to producing a magnetic field defined by a magnetic flux extending radially outward from the optical axis, the apparatus can produce an axial magnetic field (e.g., at the first surface) that has substantially zero magnitude. The axial position of the zero-magnitude axial magnetic field is preferably adjustable.

As indicated above, the first electromagnetic lens can be cylindrical about the optical axis. The cylinder can have a bore diameter D and can comprise a magnetic pole having an inside surface. In such an instance, the required magnetic field for guiding the SEs can be produced by spacing the objective lens from the specimen such that the inside surface of the magnetic pole is spaced a distance L>D from the first surface of the specimen.

According to another aspect of the invention, an apparatus is provided for collecting and/or detecting SEs from a specimen. The apparatus comprises a CPB optical system and a SE collector and/or a SE detector. The CPB optical system is preferably situated so as to direct a charged-particle beam from a source to a location on a first surface of a specimen. The beam has sufficient energy to produce SEs when the charged-particle beam impinges on the location. The CPB optical system has an optical axis and comprises a first electromagnetic lens situated adjacent the first surface of the specimen. The first electromagnetic lens produces a first magnetic field having a first magnetic flux. The apparatus also comprises a second electromagnetic lens having an axis and situated adjacent a second surface of the specimen that is opposite the first surface. The second electromagnetic lens produces a second magnetic field having a second magnetic flux. SEs produced at the location when it is struck by the charged-particle beam propagate along the first magnetic flux to a SE detector or SE collector situated so as to collect and detect the SEs. The second magnetic field can be attractive or, preferably, repulsive to the first magnet field to cause the first magnetic flux to extend radially outward from the location parallel to the first surface of the specimen. The apparatus can include a deflector situated so as to deflect the charged-particle beam over a region of the first surface including the location. The apparatus, especially if it comprises multiple SE detectors, preferably includes a processor to which the SE detectors are connected. The processor is operable to produce image-encoding signals from electrical signals received from the SE detectors. The processor is preferably connected to a display that is operable to produce an image from the image-encoding signals received from the processor.

According to yet another aspect of the invention, an apparatus is provided for scanning a specimen with a charged-particle beam to produce and display an image of the specimen. Such an apparatus comprises a CPB source that generates a charged-particle beam, an electromagnetic lens, a scanner, a SE detector, a processor, and a display. The electromagnetic lens has an optical axis and is situated so as to direct the charged-particle beam onto a location on a surface of the specimen (the optical axis extending through the location). The scanner is situated so as to scan the charged-particle beam, directed by the electromagnetic lens, over a region of the surface including the location. The SE detector is situated so as to detect SEs generated by impingement of the charged-particle beam at the location. The processor is connected to the SE detector so as to receive electrical signals from the SE detector and generate therefrom image-forming signals. The display is connected to the processor and is operable to form an observable image of the region on the surface of the specimen based on the image-forming signals received from the processor. The apparatus also comprises means (e.g., a magnet) for generating a magnetic field having a magnetic flux extending radially outward from the location and parallel to the surface of the specimen. The magnetic field axially adjacent the location preferably has zero magnitude.

According to yet another aspect of the invention, a scanning-type apparatus is provided for producing an image of a surface of a specimen using a charged-particle beam. The apparatus comprises a CPB source for generating a charged-particle beam and for directing the beam along an optical axis. The apparatus also comprises a first electromagnetic lens situated so as to focus the charged-particle beam at a location on the first surface of the specimen. The first electromagnetic lens is preferably situated along the optical axis adjacent the first surface, and is operable to produce a first magnetic field. The apparatus also comprises a scanner situated so as to scan the charged-particle beam across a region of the first surface including the location. A SE detector and/or SE collector is situated so as to collect and detect SEs generated by interaction of the charged-particle beam with the region scanned by the charged-particle beam. A display, connected to the SE detector and/or SE collector, is operable to form an observable image of the region of the specimen based on electrical signals received from the SE detector and/or SE collector. The apparatus also comprises a second electromagnetic lens situated adjacent a second surface of the specimen opposite the first surface. The second electromagnetic lens produces a second magnetic field. The second magnetic field interacts with the first magnetic field to produce a magnetic flux that causes SEs to propagate from the region to the SE detector. To such end, an axial magnetic field at the first surface preferably has zero magnitude.

Preferably, multiple (preferably an even number of) SE detectors and/or SE collectors are employed, individually placed radially with respect to the optical axis along the magnetic flux. If multiple SE detectors and/or SE collectors are used, a selector switch can be used to allow a signal from any of the detectors and/or collectors to be routed to the display. To facilitate collection of the SEs, the SE detector(s) and/or SE collectors can be positively biased.

According to yet another aspect of the invention, methods are provided for detecting a mark on an exposed surface in an electron-beam exposure apparatus. In a preferred embodiment of the method, an electron beam is propagated along an optical axis while being subjected to an accelerating potential of at least 50 kV. The mark is scanned with the electron beam to cause scattering of electrons from the mark and to generate SEs propagating from the mark. The SEs are magnetically urged to propagate away from the optical axis. The SEs are collected or detected so as to produce an electronic signal; the signal is processed to produce data concerning a characteristic of the mark (e.g., an image of the mark).

According to yet another aspect of the invention, an electron-beam exposure apparatus is provided that comprises an electron-beam source for generating an electron beam having an energy of at least 50 kV and for directing the electron beam along an optical axis. The apparatus includes a projection lens situated so as to produce a first magnetic field and to project the electron beam over a region of a first surface of a specimen placed adjacent the projection lens such that the optical axis passes through the first surface. A scanner is used to scan the electron beam over the region and produce scattered electrons. The scattered electrons interact with the region to produce SEs. The SEs are detected by a SE detector or collected by a SE collector. The apparatus also includes a magnetic-field source that is situated so as to produce a second magnetic field. The first and second magnetic fields can interact with each other to produce an axial magnetic field (e.g., in an axial region of the first surface) to have zero magnitude. Interaction of the first and second magnetic fields preferably generates a magnetic flux that extends radially away from the optical axis and guides the SEs radially away from the optical axis. Preferably, multiple SE detectors or SE collectors are provided, preferably arranged radially with respect to the optical axis, to detect or collect, respectively, the SEs.

According to yet another aspect of the invention, an SE-detecting or SE-collecting device is provided. A preferred embodiment of the device comprises a CPB optical system, a SE detector or SE collector, respectively, and means for forming a magnetic field having a magnetic flux. The CPB optical system is situated so as to receive a charged-particle beam propagating along an optical axis, and to direct the charged-particle beam to a location on a specimen. The SE detector or SE collector is situated so as to detect or collect, respectively, SEs emitted from the location on the specimen as a result of impingement of the charged-particle beam on the location. The SE detector or SE collector is preferably positively biased to facilitate attraction of SEs. The magnetic flux produced by the magnetic-field-forming means guides the SEs toward the SE detector or SE collector.

According to another aspect of the invention, a mark-detecting device is provided that is operable to collect or detect SEs emitted from a first surface of a specimen when a mark on the first surface is struck by a charged-particle beam. The device comprises a CPB source (e.g., an electron-beam source), a scanner (such as a deflector), an SE detector or SE collector, a means for forming a magnetic field, and a processor. The CPB source produces the beam and directs the beam along an optical axis onto the mark on the first surface. The scanner scans the beam over the mark. The SE detector or SE collector is situated (preferably at a location laterally displaced from the optical axis) so as to detect or collect, respectively, SEs produced by impingement of the charged-particle beam on the mark. To such end, the SE detector or SE collector is preferably positively biased. The magnetic-field-forming means forms a magnetic field, relative to the optical axis, having a magnetic flux that guides the SEs from the mark to the SE detector or SE collector. The processor, connected to the SE detector or SE collector, is operable to calculate at least one parameter selected from a group consisting of mark position, mark resolution, and field distortion from electrical signals received by the processor from the SE detector or SE collector. The charged-particle beam can be directed so as to impinge on the mark perpendicularly to the first surface.

The apparatus can further comprise an objective lens situated on the optical axis such that the charged-particle beam passes through the objective lens. The objective lens is preferably situated so as to be adjacent the first surface whenever the specimen is positioned to allow the charged-particle beam to impinge on the mark. Further preferably, the objective lens produces a magnetic field that interacts with the magnetic field produced by the magnetic-field-forming means.

The apparatus can comprise multiple SE detectors or SE collectors situated peripherally relative to the objective lens. In such a configuration, the magnetic-field-forming means forms the magnetic flux that extends radially outward from the optical axis parallel to the first surface so as to guide the SEs to the SE detectors or SE collectors. (Such a configuration of the magnetic flux can be accomplished by interaction of the magnetic fields produced by the objective lens and the magnetic-field-forming means.) Further preferably, a magnetic field at an axial location on the first surface has zero magnitude.

The magnetic-field-forming means can be a magnet such as a permanent magnet, electromagnet, electromagnetic lens, or analogous component.

According to yet another aspect of the invention, an electron-beam-exposure apparatus is provided. The apparatus comprises an electron-beam (EB) source that generates an electron beam having an energy of at least 50 kV, a projection lens, a scanner, and a SE detector or SE collector. The projection lens is situated relative to an optical axis so as to project the electron beam onto a mark on the surface of a specimen (e.g., a reticle or wafer). The mark comprises a material that scatters electrons and generates SEs whenever the mark is struck by the electron beam. The projection lens has a magnetic pole oriented toward the specimen and comprising an inside surface. The magnetic pole has a diameter D extending across the optical axis. The scanner is situated so as to scan the electron beam over the mark. The SE detector or SE collector is situated so as to interact with scattered electrons and SEs generated by impingement of the electron beam on the mark. The projection lens is situated such that the inside surface of the magnetic pole is a distance L (parallel to the optical axis) from the surface of the specimen, wherein L>D.

The foregoing and additional features and advantages of the invention will be more readily apparent from the following detailed description, which proceeds with reference to the accompanying drawings. The drawings and the embodiments they depict are not to be construed as limiting in any way.

DETAILED DESCRIPTION

The invention is described below in connection with various example embodiments which represent the current best mode of the invention.

Any embodiment of an apparatus according to the present invention can include one or more secondary-electron (SE) detectors or SE collectors, depending on the specific utility of the embodiment. To avoid excess and possibly confusing text in the following description, it will be understood that the term "secondary-electron detector" ("SE detector") is intended to encompass (in addition to various SE detectors that can be used) any of various secondary-electron collectors (SE collectors). It will also be understood that an SE collector can be readily substituted for a SE detector, and vice versa, in any of said embodiments.

Example Embodiment 1

Figure 1:
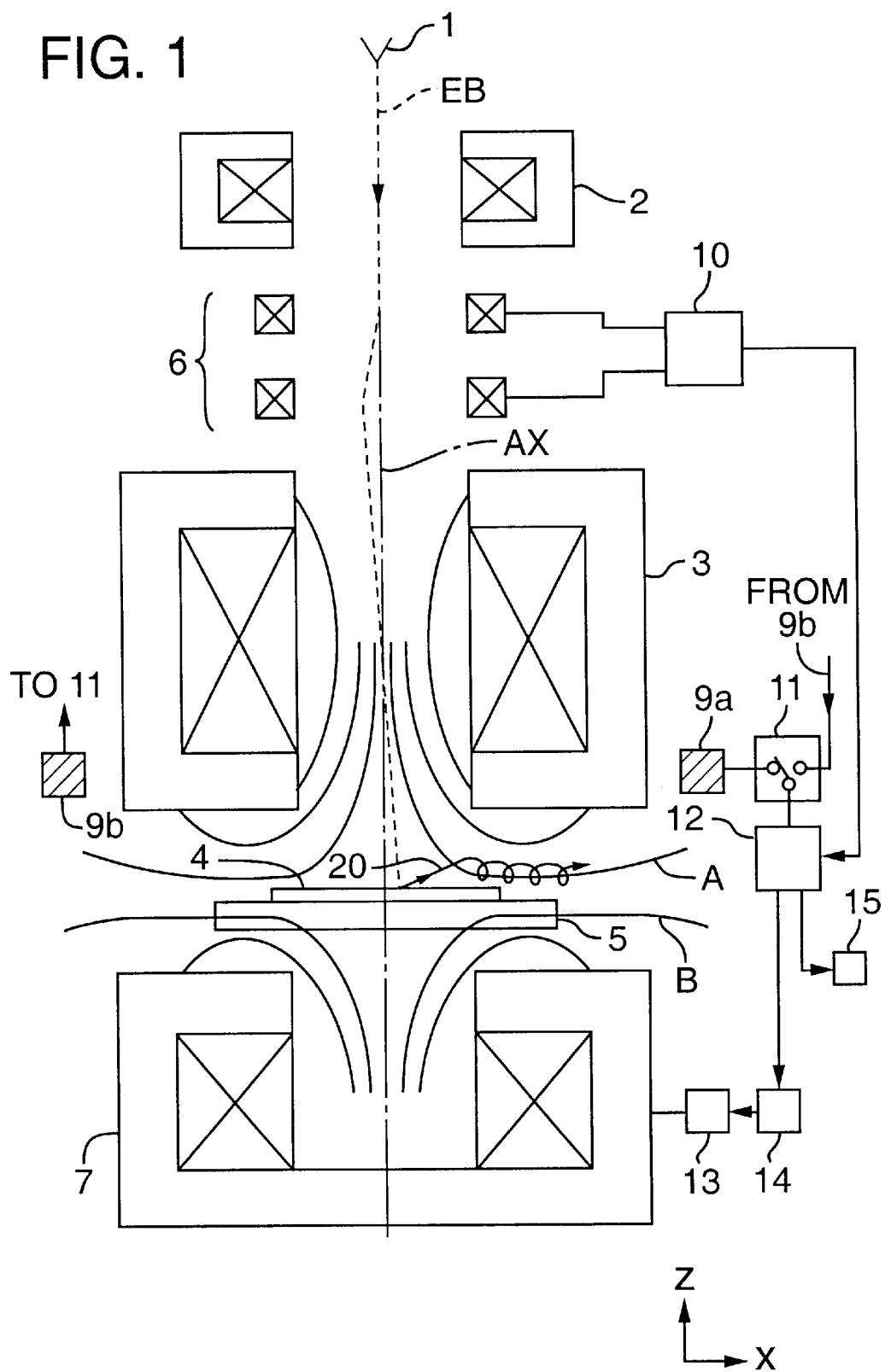
FIG. 1 is a schematic elevational depiction of a scanning-type imaging apparatus according to Example Embodiment 1, especially for use as a scanning electron microscope.

This example embodiment, depicted in FIG. 1, is directed to a scanning-type specimen-image displaying apparatus such as a scanning electron microscope (SEM). An electron-beam source 1 generates an electron beam EB that is finely focused by a condenser lens 2 and an electromagnetic objective lens 3. The electron beam EB passing through the objective lens 3 is irradiated on a specimen 4 mounted on a specimen stage 5. Deflectors 6 deflect the electron beam EB appropriately in the x and y directions so as to scan the electron beam EB over the surface of the specimen 4 in two (x and y) dimensions. An electromagnetic lens 7 is situated on the opposite side of the specimen 4 relative to the objective lens 3. The magnetic field produced by the electromagnetic lens 7 has a magnetic flux that extends along the optical axis AX in a direction opposite the direction of the magnetic flux produced by the objective lens 3. I.e., the magnetic fields produced by the lenses 3 and 7 repel each other. The respective magnetic fluxes are denoted by the lines A and B. Mutual repulsion causes the magnetic fluxes A, B to radiate outward from the optical axis in a region between the lenses 3, 7; this region is in the vicinity of the specimen 4. Preferably, the specimen is located in the region where the magnetic fluxes A, B are the most dense.

The SE collectors or detectors 9a, 9b, . . . , are placed radially relative to the optical axis AX for collecting or detecting, respectively, SEs 20 released from the specimen 4 by impingement of the electron beam EB with the specimen 4. By way of example, the SE collectors or detectors 9a, 9b . . . , can be any of various types such as (but not limited to) a scintillator with photomultiplier (PMT) in which SEs are absorbed by the scintillator which releases light photons that are detected by the PMT and converted into corresponding electrical signals. The SE collectors or detectors 9a, 9b . . . , are preferably positively biased. Thus, in connection with the electrical field formed between the specimen 4 and the SE collectors or detectors 9a, 9b . . . , SEs are readily captured by the SE collectors or detectors 9a, 9b, . . . Signals from the SE collectors or detectors 9a, 9b, . . . , are routed to a selector switch 11 which selectively directs signals from specific SE collectors or detectors to a processor 12.

The deflectors 6 are connected to a power supply 10. The power supply 10 energizes the deflectors 6 appropriately for scanning and sends a corresponding scanning signal, synchronized to the scanning excitation of the deflector 6, to the processor 12. The electromagnetic lens 7 is connected to and powered by a power supply 13 connected to a regulator 14. The regulator 14 regulates the power delivered to the electromagnetic lens 7 based on a signal routed to the regulator 14 from the processor 12. A monitor or analogous display device is connected to the processor 12. The processor 12 routes image-forming signals to the display 15.

Figure 2:
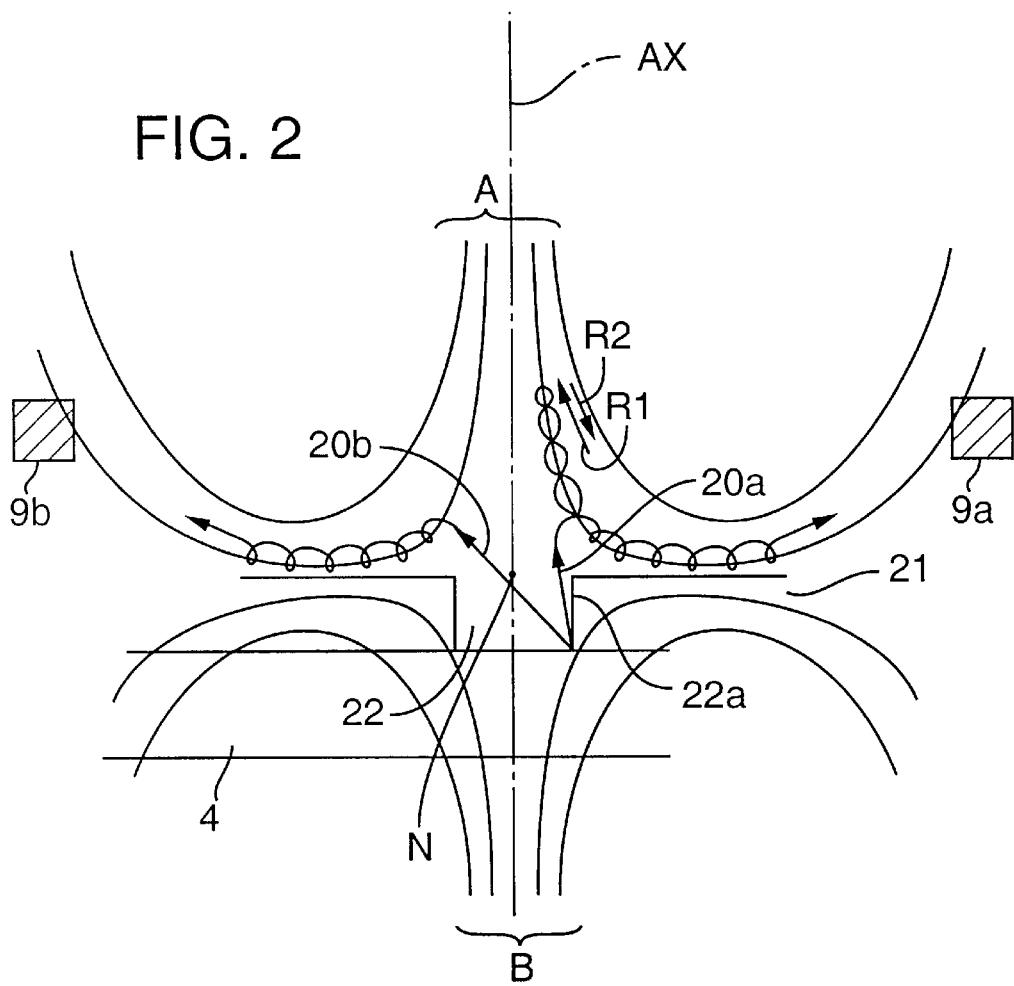
FIG. 2 is an enlarged view of the region of FIG. 1 near the specimen surface, showing the lines of magnetic flux.

FIG. 2 provides an enlarged view of magnetic-flux profile in the vicinity of the specimen 4. The magnetic flux designated "A" is generated by the objective lens 3, and the magnetic flux designated "B" is generated by the electromagnetic lens 7. The specimen 4 (e.g., wafer) has on its upper surface a layer of resist 21 defining a groove 22 having side walls 22a. In FIG. 2, the mutually repelling magnetic fields denoted by the magnetic fluxes A, B produce a null point N on the axis AX at about the level of the upper surface of the resist 21. FIG. 2 also depicts representative orbits of SEs emanating from a groove 22 on the surface of the specimen 4. In FIG. 2, the groove 22 extends depthwise through a layer of resist 21 on the specimen surface. The profile of the magnetic fluxes in FIG. 2 is as employed, for example, in cusped-type plasma confinement. Charged particles (such as SEs) in such a magnetic flux can only escape in a direction that is radial to the axis AX and parallel to the specimen surface. Thus, SEs emitted at a small angle relative to the side wall 22a of the groove 22 propagate initially upward in a spiraling trajectory along the magnetic flux A as indicated by the arrow R1. As the SEs propagate further upward, the density of the magnetic flux increases such that the Miller effect causes the SEs to turn around and propagate back toward the specimen 4 along the magnetic flux A as indicated by the arrow R2.

SEs emitted at a large angle relative to the optical axis AX, e.g., SEs propagating along the trajectory 20b, proceed along the magnetic flux A radially away from the optical axis AX. Near the surface of the resist 21, the magnetic flux A spreads out radially, relative to the optical axis AX, without intersecting the resist surface. Thus, SEs of any of various trajectories 20a, 20b propagate along the magnetic flux A radially outward relative to the optical axis AX to the SE collectors or detectors 9a, 9b, . . .

Electrical output signals produced by the SE collectors or detectors 9a, 9b, . . . , are routed to the selector switch 11. If it is desired to, e.g., observe the profile of the side wall 22a, nearly all SEs released from the side wall 22a proceed leftward in the figure along the magnetic flux relative to the optical axis AX. The selector switch 11 permits signals from selected SE detectors 9b to reach the processor 12. Image information based on the selected detection signals as well as scanning signals from the scanning power supply 10 are directed to the monitor 15 from the processor 12. Thus, by adjusting luminance, a higher-contrast image of the specimen surface (i.e., image produced by the SEs as image-generators) can be displayed on the monitor 15.

By increasing the energy supplied to the electromagnetic lens 7, the magnetic field (denoted by the flux B) generated by the electromagnetic lens 7 can be increased in magnitude so as to shift the null point N axially toward the objective lens 3. Similarly, reducing the energy supplied to the electromagnetic lens 7 relative to the objective lens increases the magnitude of the magnetic field (denoted by the flux A) relative to the magnetic field denoted by the flux B, thereby shifting the null point N axially toward the electromagnetic lens 7. (As stated above, in FIGS. 1 and 2, the electromagnetic lens 7 is energized sufficiently to place the null point N on the axis at about the level of the surface of the resist 21.

Advantages of this example embodiment are as follows:

(1) The magnetic field created by the electromagnetic lens 7 causes the resultant magnetic flux to extend radially outward from the optical axis AX. Consequently, most of the SEs emitted from the specimen 4 propagate to the SE collectors or detectors 9a, 9b, . . . , regardless of the trajectory angle of the SEs, thereby yielding a detection signal having a high signal-to-noise ratio. Thus, SEs can be collected and/or detected efficiently even when the SE collectors or detectors must be placed a significant distance outward from the optical axis AX (to relieve space constraints) rather than radially near the specimen 4. The radial orientation of the magnetic flux also reduces crosstalk of the SE collectors or detectors with each other.

(2) Because the SE collectors or detectors 9a, 9b, . . . , can be placed radially a significant distance from the optical axis AX, and because the SE collectors or detectors can be placed radially symmetrically relative to each other and with respect to the optical axis AX, any effect of the electrical potential of the SE collectors or detectors on the electron beam EB incident on the specimen 4 is reduced.

(3) Use of the selector switch 11 to selectively direct electrical signals from the multiple SE detectors 9a, 9b . . . , simplifies specification of a direction (relative to the specimen 4) in which to make an observation of the specimen.

(4) Since the null point N on the optical axis AX where the axial magnetic field is zero can be axially moved by adjusting the amount of electrical energy supplied to the electromagnetic lens 7, the null point can be adjusted to produce an image of the specimen having a maximal signal-to-noise ratio. Such adjustments can also be made to offset any effects of the particular topology of the specimen surface that could otherwise adversely affect the quality of the image.

(5) Because the SEs do not remain in the vicinity of the optical axis, no charging by the SEs occurs in such regions. Thus, the electron beam propagating along the optical axis remains stable.

Figure 3:
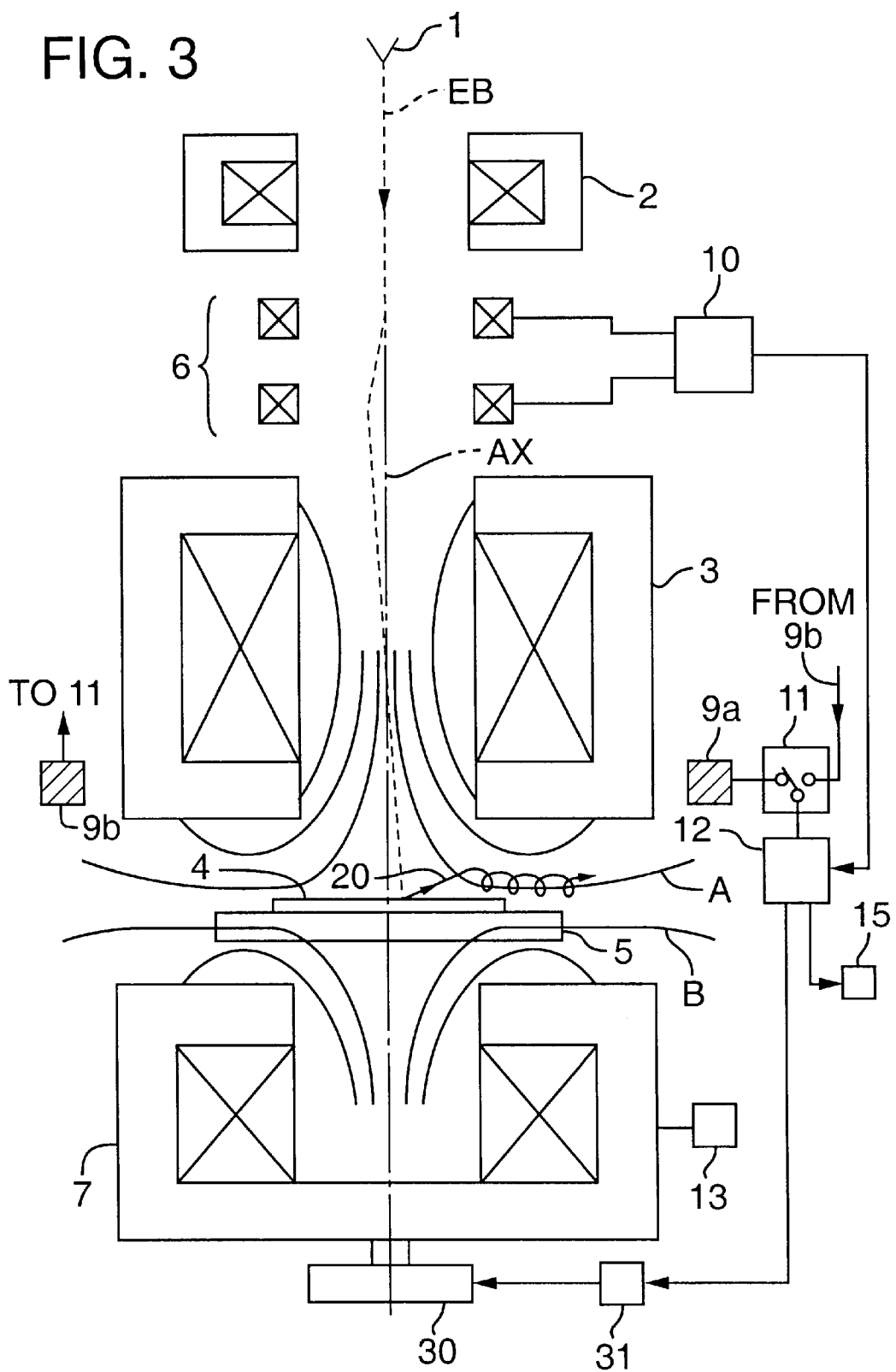
FIG. 3 is a schematic elevational depiction of a first alternative configuration to the FIG. 1 embodiment.

A first alternative configuration of the FIG. 1 embodiment is shown in FIG. 3, in which components that are the same as in FIG. 1 have the same reference designators. The FIG. 3 embodiment includes a lens actuator 30 operable to move the electromagnetic lens 7 up and down (in the figure) along the optical axis AX. Movement of the electromagnetic lens 7 is governed by a regulator 31 that imposes limits, based on signals from the processor 12, on the range of motion in which the lens actuator 30 can axially move the electromagnetic lens 7. In the FIG. 1 apparatus, the null point N was axially shifted by altering the electrical excitation of the electromagnetic lens 7; in the FIG. 3 apparatus, the null point N is shifted by causing the lens actuator 30 to move the electromagnetic lens 7 along the optical axis AX.

If high-resolution observations cannot be made due to aberration problems arising with the electron beam EB, the direction in which electrical current flows through the electromagnetic lens 7 can be reversed such that the magnetic field generated by the electromagnetic lens 7 has the same orientation as the magnetic field generated by the objective lens 3. As a result, the orientation of the resulting magnetic flux is made nearly perpendicular to the surface of the specimen 4 which can improve image resolution under such conditions. Under such conditions, the objective lens 3 and the electromagnetic lens 7 effectively form an immersion-type lens. Since the principal surface of the objective lens 3 is situated in close proximity to the specimen 4, coefficients of chromatic aberration and spherical aberration can thus be reduced, allowing the electron beam EB to be further stopped down. Although, under such conditions, detection of SEs is more difficult, this can be overcome at least in part by applying a higher current in the direction of the SE detectors so that the SEs are drawn toward the SE collectors or detectors 9a, 9b . . . .

Figure 4:
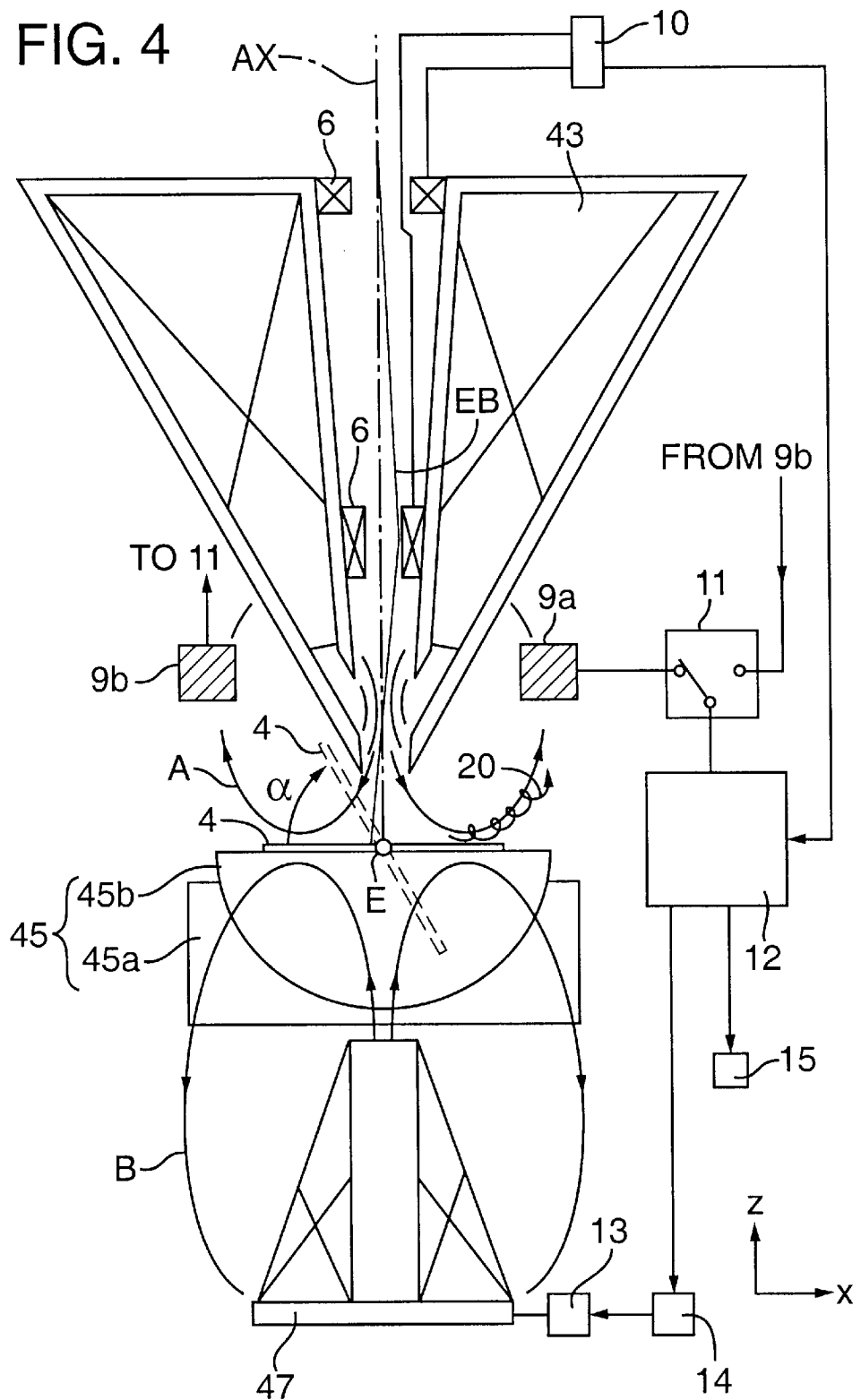
FIG. 4 is a schematic elevational depiction of a second alternative configuration to the FIG. 1 embodiment.

A second alternative configuration of the FIG. 1 embodiment is shown in FIG. 4, in which components that are the same as in FIG. 1 have the same reference designators (the electron-beam source 1 and condenser lens 2 are not shown in FIG. 4). In the FIG. 1 configuration, the objective lens 3 and the electromagnetic lens 7 are each cylindrically shaped; in the FIG. 4 configuration, in contrast, the electromagnetic objective lens 43 and the electromagnetic lens 47 are both conically shaped. Further with respect to FIG. 4, the specimen 4 is mounted to a specimen stage 45 comprising a movable section 45a that can move along the x and y axes and a pivoting (tilting) section 45b that can pivot on an axis (denoted "E") parallel to the y axis and intersecting the optical axis AX so as to tilt the specimen stage 45. Since the objective lens 43 is conical, the specimen 4 can be observed by rotating it about the axis E by an angle $\alpha$ (e.g., 60° in FIG. 4), as indicated by the broken line. SE collectors or detectors 9a, 9b, . . . , are situated so as not to interfere with the specimen 4 or with movement of the pivoting section 45b.

In the FIG. 4 embodiment, the magnetic field generated by the objective lens 43 and the magnetic field generated by the electromagnetic lens 47 are reversed. Thus, the surface of the specimen 4 in the vicinity of the axis AX can be coincident with a null point at which the magnetic field is essentially zero. By changing the amount of electrical energy supplied to the electromagnetic lens 47, the axial position of the null point can be axially displaced as described above with respect to the FIG. 1 embodiment. Because the specimen can be tilted and thus be inclined relative to the optical axis AX, an observable image can be obtained from any of various directions allowing for more detailed observation of the specimen 4.

Because the SEs do not remain in the vicinity of the optical axis, no charging by the SEs occurs in such regions. Thus, the electron beam propagating along the optical axis remains stable.

Example Embodiment 2

Figure 5:
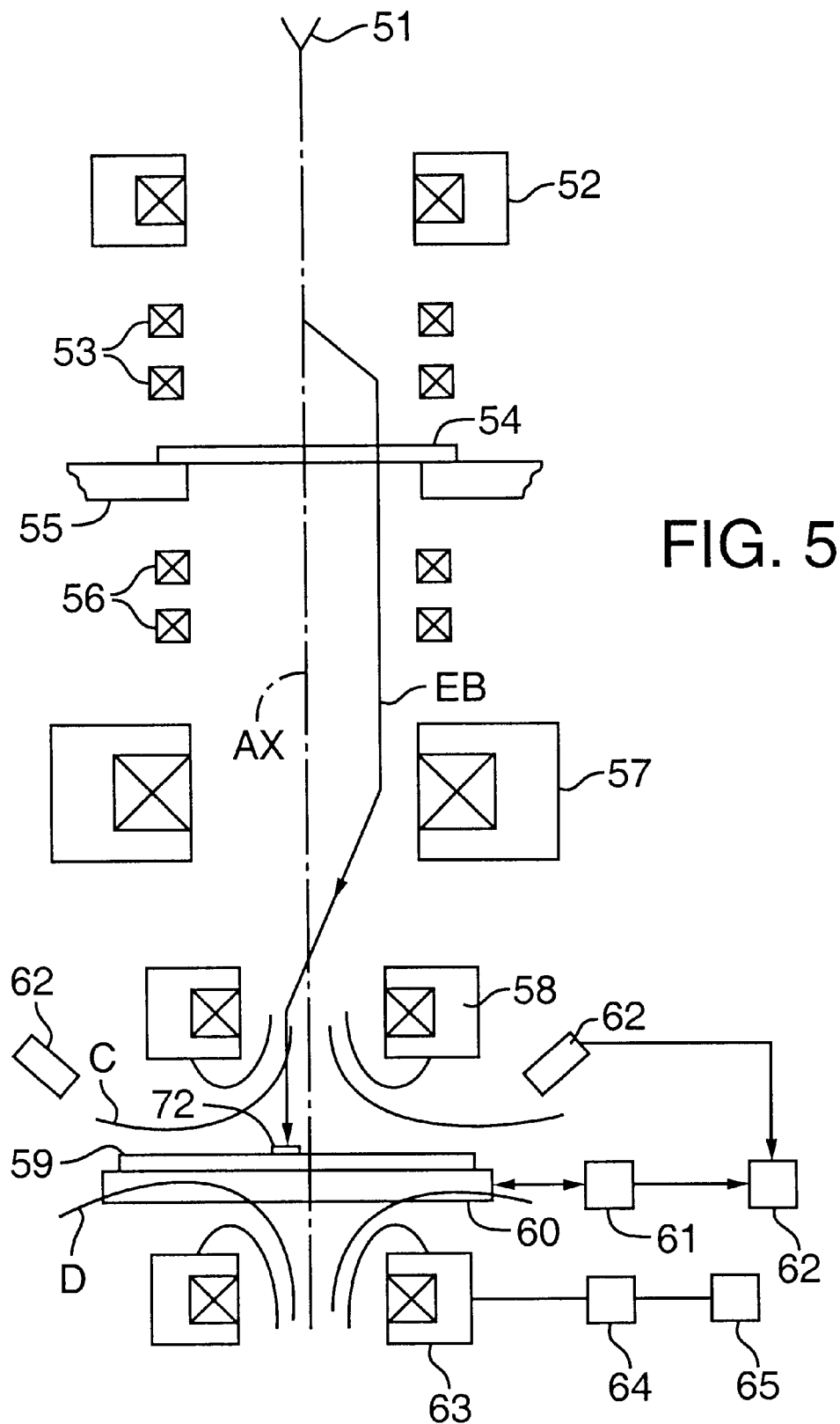
FIG. 5 is a schematic elevational depiction of an electron-beam exposure apparatus according to Example Embodiment 2.

This embodiment as depicted in FIG. 5 is directed to an electron-beam projection-exposure device. A beam EB of electrons is produced by an electron-beam source 51. The electron beam EB passes through a condenser lens 52 that focuses the beam EB. The beam EB passes through a deflector 53 that deflects the electron beam EB so that the beam is incident on a desired location on a mask 54.

The mask 54 is mounted to a mask stage 55 that moves the mask 54 in the x- and y-axis directions. After passing through the mask 54, the electron beam EB encounters a deflector 56 that deflects the beam as required in the x- and y-axis directions to appropriately direct the beam for impingement at a desired location on a wafer 59. The beam passes through a first projection lens 57 and a second projection lens 58.

The wafer 59 is mounted on a wafer stage 60 that moves the wafer 59 as required in the x- and y-axis directions. The position of the wafer stage 60 in the x-y plane is detected by a position detector 61 (e.g., laser interferometer).

SEs produced at the site on the wafer at which the electron beam is incident are collected and/or detected by SE collectors or detectors, respectively, 62. Preferably, an even number of SE collectors or detectors 62 are situated in axially symmetrical positions relative to the optical axis AX (only two SE collectors or detectors 62 are shown). Each SE collector or detector 62 is preferably configured as a scintillator and a photoelectric PMT, as described above, or a multi-channel plate. The SE collectors or detectors 62 are preferably situated at positions that are displaced from the optical axis AX but downstream of the second projection lens 58 along the flux C denoting a magnetic field produced by the second projection lens 58. The wafer 59 comprises a mark 72, the position of which mark 72 is determined by processing of electronic signals produced by the position detector 61 and the SE collectors or detectors 62.

An electromagnetic lens 63 is situated on the opposite side of the wafer 59 relative to the projection lenses 57, 58. Electrical power delivered to the electromagnetic lens 63 is supplied by a power supply 64 the output of which is regulated by a regulator 65. The electromagnetic lens 63 is preferably excited to produce a magnetic field that is repulsive to the magnetic field produced by the second projection lens 58. That is, the resulting magnetic flux C produced by the second projection lens 58 and the magnetic flux D produced by the electromagnetic lens 63 preferably converge in the vicinity of the wafer 59; excitation of the electromagnetic lens 63 is preferably controlled so that the axial magnetic field on the surface of the wafer 59 is essentially zero.

In conventional electron-beam exposure devices, the accelerating voltage is approximately 20 to 30 kV. However, for high-resolution exposures using an electron-beam, higher accelerating voltages have been recently used to increase throughput and reduce aberrations, Coulomb-effect blur, and proximity effects. Unfortunately, under such higher accelerating voltages, high-precision detection of marks on the wafer was difficult because, e.g., a 100-keV electron beam causes a scattering zone of about 100 $\mu$m to spread through the interior of the wafer. This reduces the contrast of the reflected-electron signal generated as described above.

This example embodiment corrects such a problem. The electrons accelerated by the accelerating voltage interact with the material of the specimen (wafer) at the subject mark to generate scattered electrons with primary information. These scattered electrons interact with any substances (e.g., resist) on the specimen surface in the vicinity of the mark and generate SEs that can be efficiently collected or detected by the SE collectors or detectors, respectively, 62 to detect the position of the mark.

If the accelerating voltage of the electron beam EB directed at the wafer 59 is in the conventional range of 20 to 30 keV, interaction of the impinging electrons and the wafer 59 tends to produce reflected electrons having primary information. In a conventional electron-beam exposure device, the position of the mark on the wafer would be detected by detecting these reflected electrons.

Figure 6:
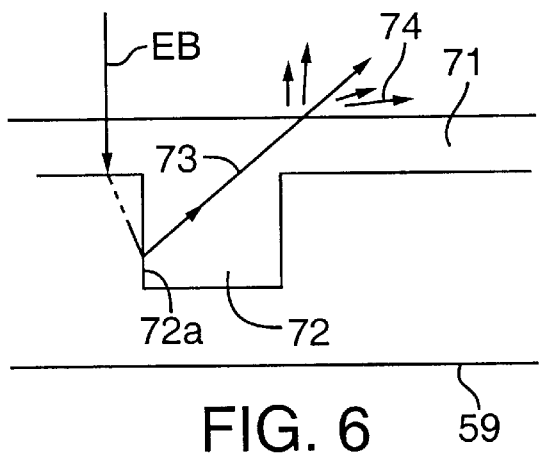
FIG. 6 is an enlarged view of the region of the specimen 59 in the FIG. 5 embodiment, showing the generation of secondary electrons.

As the accelerating voltage increases (as permitted using the apparatus of FIG. 5), the electrons of the beam penetrate a greater distance depthwise into the wafer 59 before scattering. As shown in FIG. 6, deeply scattered electrons generated, e.g., at a wall 72a of a groove 72 in the resist 71 can generate SEs 74 at the surface of the resist 71 when the scattered electrons encounter the surface of the resist 71. Such SEs have primary information.

Figure 7:
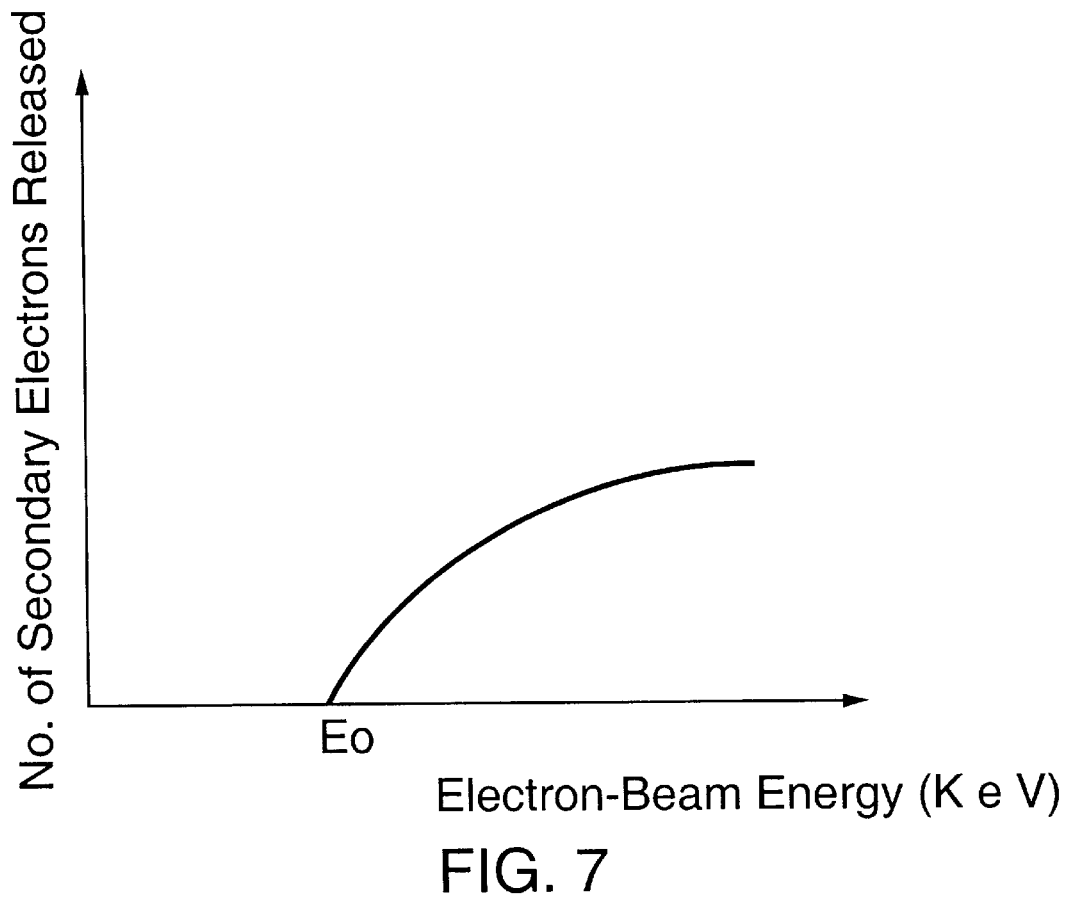
FIG. 7 is a plot of a relationship between electron-beam energy and the number of secondary electrons released from a surface bombarded by the electron beam.

A qualitative relationship between the number of SEs that are generated and the energy of the electron beam EB is depicted in FIG. 7. Whenever the energy is greater than or equal to a threshold value $E_0$, SEs 74 are generated. As the energy increases further, the number of SEs that are generated increases.

The value $E_0$ is a function of the energy necessary for the scattered electrons 73 to escape the surface of the resist 71 after the electron beam EB has passed through the resist 71 and into the interior of the wafer 59 and scattered. Normally, $E_0$ is about 50 keV. As the energy of the electron beam EB increases, the sectional area releasing SEs decreases and the number of released SEs decreases. However, as shown in the FIG. 6, if the resist 71 is present, the electron beam loses energy as it propagates through the resist. By the time the electron beam passes through the surface of the resist 71, the energy level of the electrons is considerably lower. This yields a larger scattered sectional area of the released SEs, a larger number of released SEs, a stronger signal from the SE collectors or detectors, and a correspondingly greater resolution signal for highly precise detection of the mark location.

In this example embodiment, as in the first example embodiment, the magnetic fields preferably repel each other at the wafer 59. Since this example embodiment comprises multiple SE collectors or detectors 62 placed along the magnetic flux C extending radially outward from the axis, a detection signal can be obtained having a high signal-to-noise ratio. Also, since the SE collectors or detectors 62 can be located a distance from the optical axis AX, almost no reflected electrons enter the SE collectors or detectors 62.

Since the SE collectors or detectors 62 are placed in axially symmetrical positions relative to the optical axis AX, any adverse effect of the electrical field created by the SE collectors or detectors 62 on the electron beam EB is minimized.

As with other example embodiments described above, because the SEs do not remain in the vicinity of the optical axis, no charging by the SEs occurs in such regions. Thus, the electron beam propagating along the optical axis remains stable.

Example Embodiment 3

Figure 8:
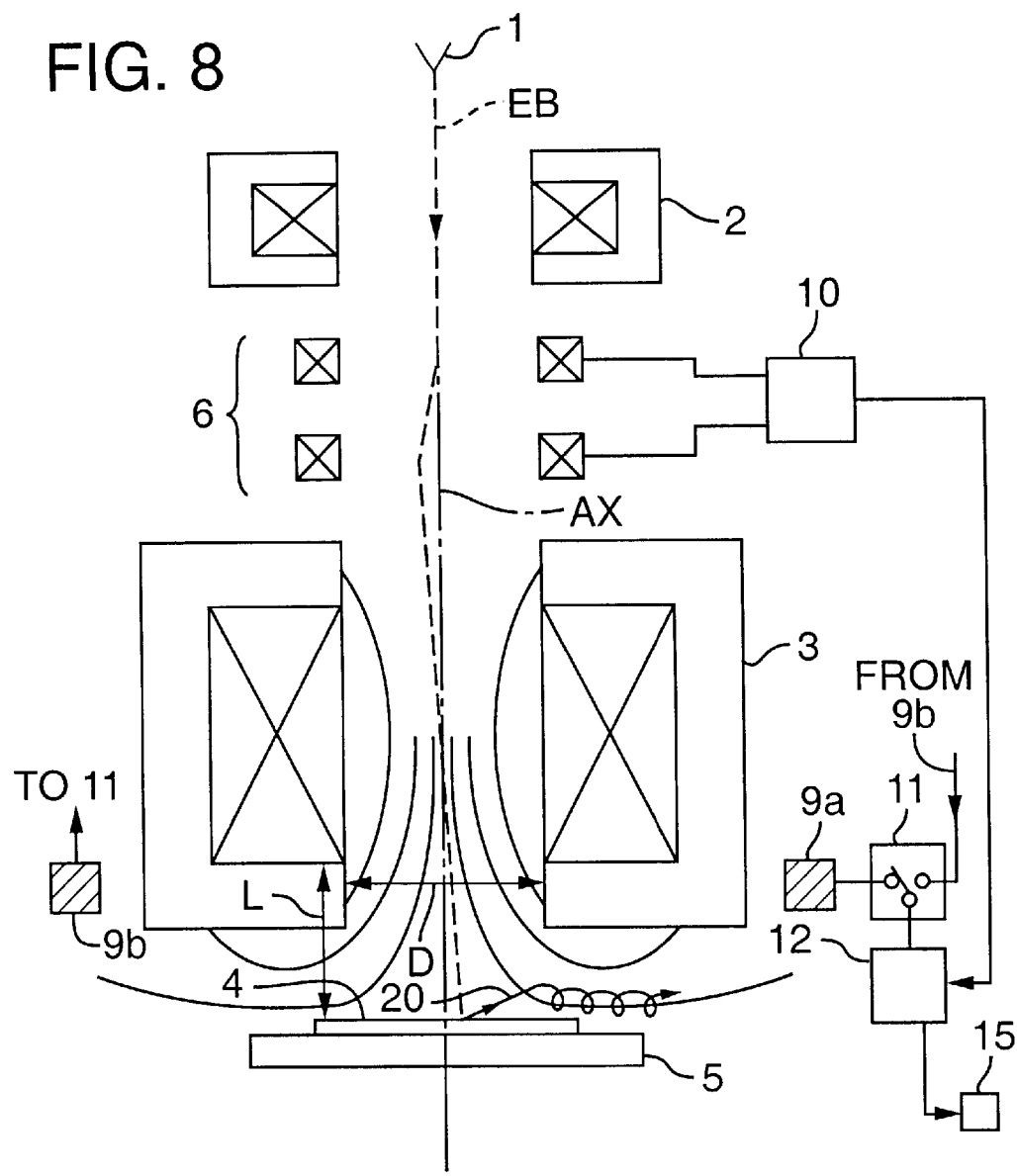
FIG. 8 is a schematic elevational depiction of an electron-beam exposure apparatus according to Example Embodiment 3.

This example embodiment is shown in FIG. 8, and differs from Example Embodiments 1 and 2 by not utilizing an electromagnetic lens situated below the specimen to cause the axial magnetic field in the vicinity of the specimen to be substantially zero. In FIG. 8, components that are the same as in FIG. 1 have the same reference designators and are not described further. Unless discussed otherwise below, the identity and arrangements of components in FIG. 8 are the same as in FIG. 1.

In FIG. 8, the objective lens 3 has a bore diameter D. Also, the distance between the inside surface of the magnetic pole of the objective lens 3 and the surface of the specimen 3 is designated L, wherein L>D. Whenever L>D, the axis-direction magnetic field in the vicinity of the optical axis of the specimen surface is essentially zero. As a result, the magnetic flux extending between the objective lens 3 and the surface of the specimen 4 extends radially outward and is substantially parallel to the specimen surface. SEs produced on the specimen surface propagate radially outward along the magnetic flux and are collected and/or detected by the SE collectors or detectors 9a, 9b, . . . Thus, the apparatus of this example embodiment exhibits a substantially improved detection of SEs, and a higher signal-to-noise ratio, compared to conventional apparatus.

As in other embodiments described herein, because the SEs produced by Example Embodiment 3 do not remain in the vicinity of the optical axis, no charging by the SEs occurs in such region. Thus, the electron beam propagating along the optical axis remains stable.

Example Embodiment 1–3 were described in connection with the detection of wafer marks and the like using an electron beam. It will be understood that these embodiments can also be used for observations of the specimen such as by SEM, and for detecting and/or collecting SEs in general. In addition, the embodiments are not limited to detecting wafer marks but also any of various other features on a specimen, such as marks on reticles (masks).

In the foregoing example embodiments, the electron beam source 1 is a representative CPB source; the deflector 6 and the deflectors 53, 56 are representative scanning means; and the processor 12 with monitor 15 are representative image-forming means. Magnetic-field-generating means are represented by the objective lens 3, the electromagnetic lens 7, the power supply 13, and the regulator 14 in FIG. 1; the electromagnetic lens 7, the power supply 13, the driver 30, and the regulator 31 in FIG. 3; the magnet 47, the power supply 13, and the regulator 14 in FIG. 4; and the electromagnetic lens 63, the power supply 64, and the regulator 65 in FIG. 5.

Example Embodiment 4

Figure 9:
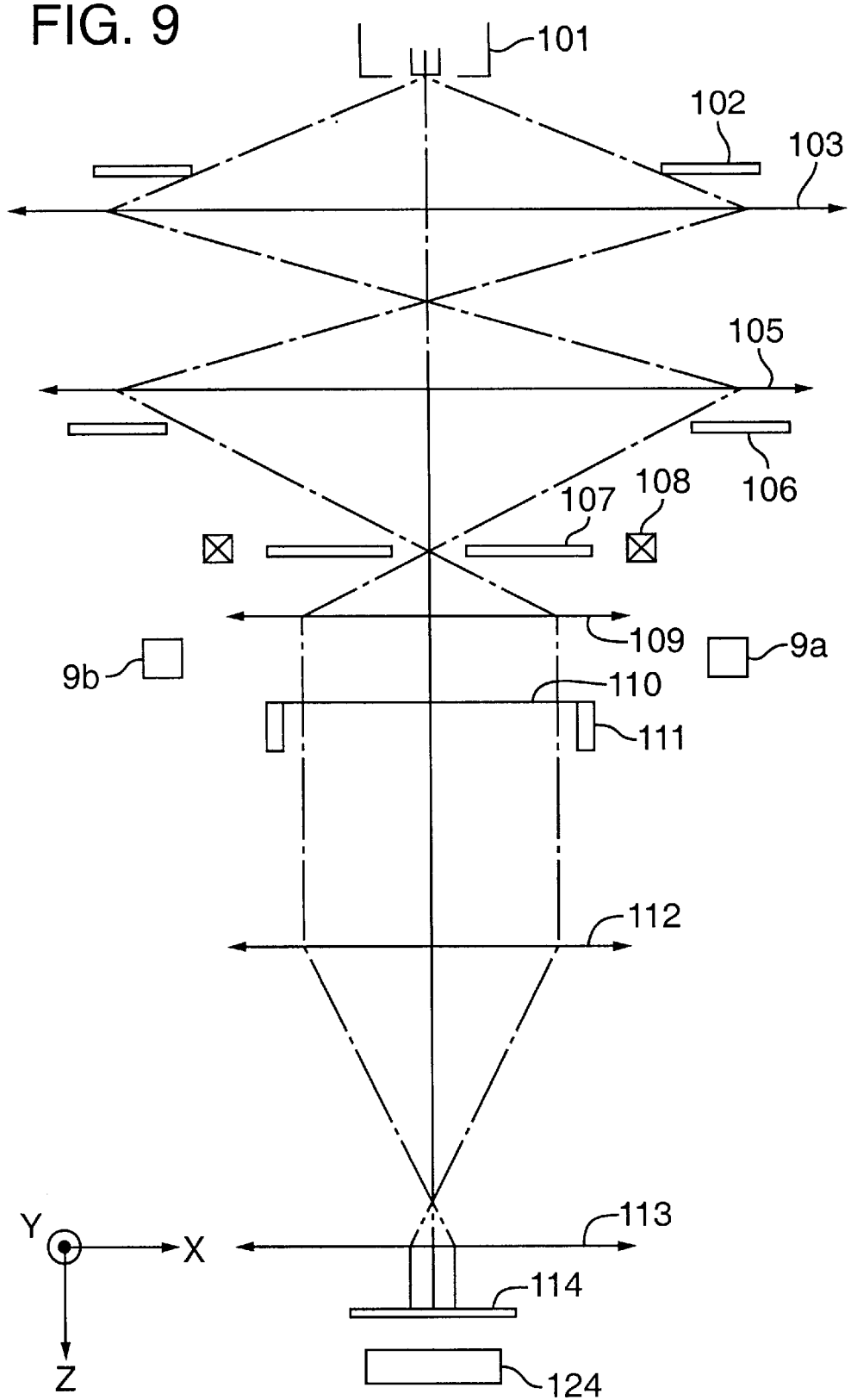
FIG. 9 is a schematic elevational depiction of an electron-beam exposure apparatus according to Example Embodiment 4.
Figure 10:
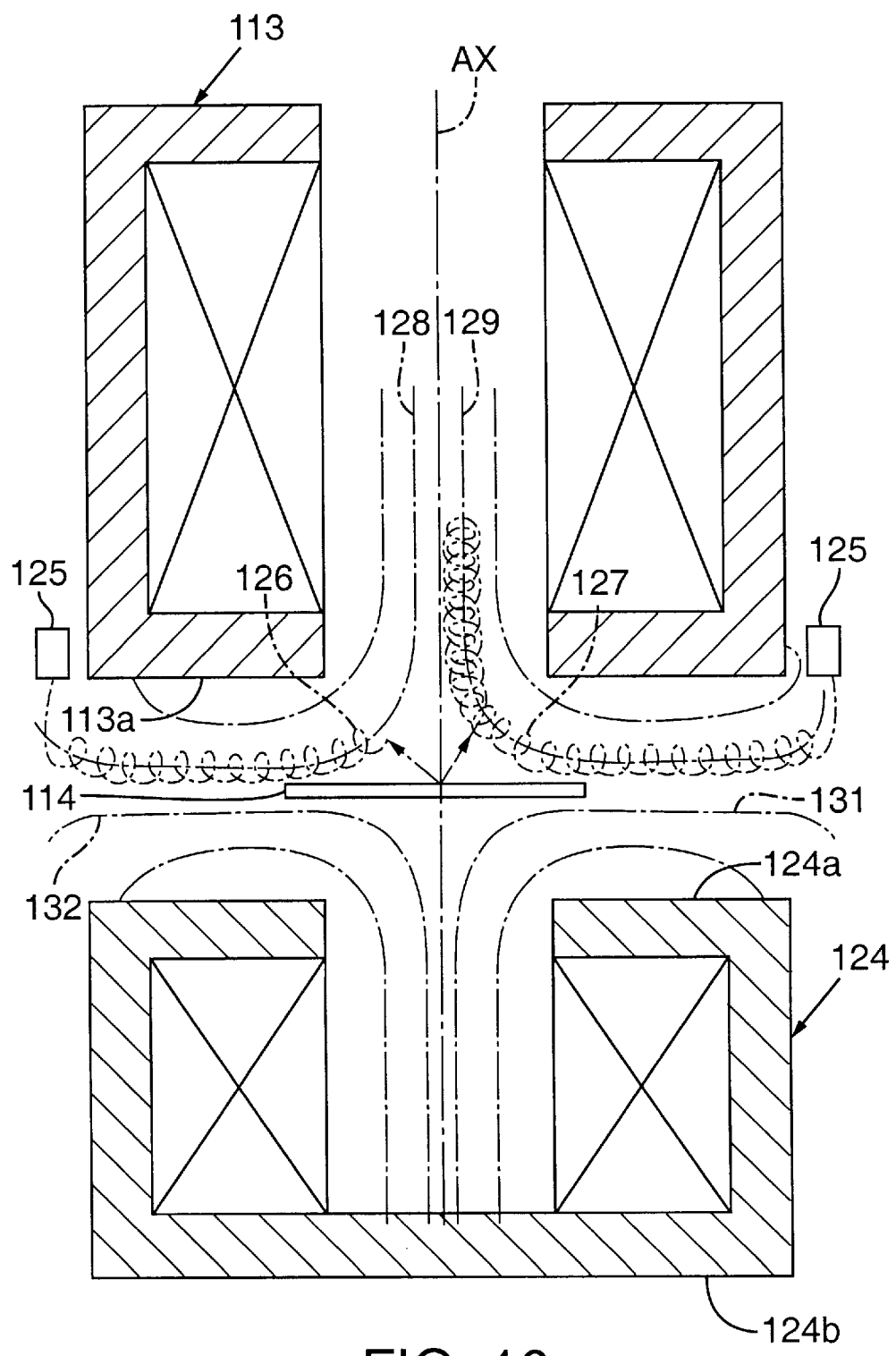
FIG. 10 is an enlarged view of the region of the specimen 114 in the FIG. 9 embodiment, showing the generation of secondary electrons.

This example embodiment is depicted in FIGS. 9–10, directed to an electron-beam reducing projection-exposure apparatus. Turning first to FIG. 9, the apparatus comprises the following components arranged in order on an optical axis AX: an electron gun 101, a first aperture 102, a first condenser lens 103, a second condenser lens 105, a second aperture 106, a blanking aperture 107, a third condenser lens 109, a reticle (mask) 110, a reticle stage 111, a first objective lens 112, a second objective lens 113, a sensitive substrate (wafer) 114, and an electromagnetic lens 124 situated below the wafer 114.

The reticle 110 defines a mask pattern that is divided into multiple segments each having multiple "mask subfields". The mask pattern is exposed by the electron beam in a sequential manner segment by segment and subfield by subfield within each segment.

The electron gun 101 generates an electron beam and directs propagation of the beam downward in the figure. The electron beam passes through the condenser lenses 103, 105 to a crossover at the blanking aperture 107 at which an image of the electron gun is produced. The two condenser lenses 103, 105 can function as zoom lenses to vary the current density at the reticle 110.

The apertures 102, 106 function to regulate the field of view of the electron beam so that the electron beam can illuminate, for example, a single subfield on the reticle 110. In this regard, the first aperture 102 defines, for example, an opening that is a regular square 1 mm on each side. The image of the first aperture 102 is imaged onto the second aperture 106 by the condenser lenses 103, 105.

The deflector 108 is operable to select the subfield on the reticle 110 that is illuminated by the electron beam. Thus, the deflector 108 is operable to deflect the electron beam in the X direction as required to sequentially expose all the subfields within a segment of the mask pattern. The condenser lens 109 collimates the electron beam for impingement on the reticle 109; as the electron beam is incident on the reticle, the beam forms an image of the second aperture 6 on the reticle 10.

In FIG. 9, only one mask subfield is shown on the optical axis AX. However, it will be understood that the reticle 10 actually extends perpendicularly outward from the optical axis AX in the X and Y directions to encompass multiple mask subfields.

The reticle 110 (extending in the X-Y plane) is mounted on the reticle stage 111 that is movable in the X and Y directions. Similarly, the wafer 114 (representative of a sensitive substrate and extending in the X-Y plane) is mounted on the wafer stage 115 that is movable in the X and Y directions. By scanning the reticle stage 111 and the wafer stage 115 in opposing Y directions during exposure, each of the subfields within a segment, and each of the segments of the mask pattern, is sequentially exposed. Also, each stage 111, 115 comprises an accurate position-measuring device (preferably a laser interferometer) to ensure that the subfield images projected onto the wafer are accurately "stitched" together on the wafer 114.

The objective lenses 112, 113 are situated below the reticle 110. As each mask subfield is irradiated by the electron beam, the electron beam passes through the objective lenses 112, 113 and produces a projected but reduced image of the mask subfield on the wafer 114. The wafer is coated with an appropriate resist that reacts upon exposure to electrons.

An enlargement of the region around the wafer 114 is shown in FIG. 10. The objective lens 113, which has a cylindrical configuration in this example embodiment, is situated immediately above the wafer 114. The electromagnetic lens 124 is situated immediately below the wafer 114. The objective lens 113 comprises a pole piece 113a extending radially outward from the optical axis AX. The electron beam passes through a space in the center of the objective lens 113.

FIG. 10 also depicts multiple SE collectors or detectors 125 that are individually arranged at a respective location near the outer perimeter of the pole piece 113a. Each SE collector or detector 125 preferably has a positive electrical potential or bias (e.g., 10 kV) to attract SEs. The SE collectors or detectors 125 are placed in radial locations about the optical axis, preferably equiangularly relative to each other. The charge applied to the SE collectors or detectors 125 defines an equipotential surface that is weaker near the optical axis AX. Because the SE collectors or detectors 125 are symmetrically placed about the optical axis, their charge-effect on the electron beam is nil.

The electromagnetic lens 124 is situated below the wafer 114 (mounted to a wafer stage that is not shown). The electromagnetic lens 124 is preferably cylindrical and is coaxial with, e.g., the objective lenses 112, 113. The electromagnetic lens 124 comprises an annular first pole piece 124a extending radially outward from the optical axis AX parallel to the wafer 114. The electromagnetic lens 124 also comprises a second pole piece 124b configured as a disk.

The objective lens 113 and the electromagnetic lens 124 are excited in a manner by which the magnetic fields produced by these lenses oppose each other. (The magnetic field produced by the objective lens 113 is denoted by the flux lines 128, 129, and the magnetic field produced by the electromagnetic lens 124 is denoted by the flux lines 131, 132.) The magnitude of each magnetic field is adjusted such that the net magnetic field at the axial region of the surface of the wafer 114 has zero magnitude. Thus, especially in the region between the wafer surface and the pole piece 113a, the resultant magnetic flux radiates outward parallel to the wafer surface.

When comparatively low-speed (2–5 eV or less) SEs are emitted from the wafer 114 in such a magnetic field, SEs emitted from the axial region of the wafer surface, SEs emitted at a small angle relative to the wafer surface (e.g., orbit 126), and SEs emitted at a large angle relative to the wafer surface (e.g., orbit 127) rotate about a respective line of force 128, 129 and assume a spiral orbit as they propagate radially outward. Thus, the SEs are guided toward peripheral regions of the pole piece 113a to the SE collectors or detectors 25. (The phenomenon of electrons emitted at a large angle relative to the wafer surface (and propagating upward in the figure parallel to the axis) and returning downward in the figure and then radially outward (e.g., orbit 27) is known as the Miller effect.) These SEs are attracted to the SE collector or detectors 125.

SEs emitted from more peripheral regions of the wafer surface 114 are guided radially outward along the flux lines 128, 129 and are attracted to the SE collectors or detectors 125. Thus, nearly all the SEs emitted from the wafer propagate to the SE collectors or detectors. This can result in production of a large detection signal (relative to noise) by the SE collectors or detectors, and highly accurate detection of, for example, a mark on the wafer surface.

The zero magnetic field at the axial region of the wafer surface allows the electron beam to impinge perpendicularly on the wafer surface. This avoids exposure problems. In addition, because the SEs do not remain in the vicinity of the optical axis, no charging by the SEs occurs in such regions. Thus, the electron beam propagating along the optical axis remains stable.

As described above, apparatus according to the invention are operable to form a magnetic flux, in the vicinity of a specimen surface, that extends radially parallel to the specimen surface. As a result, SEs released from the specimen surface propagate radially with respect to the optical axis along the magnetic flux. Such propagation allows easier and more efficient collection and/or detection of the SEs using appropriate detectors and/or collectors. This, in turn, provides much more precise detection of wafer position and an improved signal-to-noise ratio of the resulting detection signal.

The types of lenses (e.g., objective lens) described above in the example embodiments are not intended to be limiting in any way. It will be appreciated that the lenses can have any of various other functions besides what would be suggested by the name given to the lens in the description of the embodiments.

The SE collectors or detector(s) (as defined above) can also be arranged close to a mask. Thus, the SE collectors or detectors can be used to collect and/or detect, respectively, SEs propagating from a mark on the mask.

Whereas the invention has been described in connection with multiple example embodiments, it will be understood that the invention is not limited to those example embodiments. On the contrary, the invention is intended to encompass all modifications, alternatives, and equivalents as may be included within the spirit and scope of the invention as defined by the appended claims.

What is claimed is:

1. An apparatus for collecting or detecting secondary electrons from a specimen, the apparatus comprising:
   (a) a charged-particle-beam optical system situated so as to direct a charged-particle beam to a location on a first surface of the specimen, the charged-particle beam having sufficient energy to produce secondary electrons when the charged-particle beam impinges on the location, the charged-particle-beam optical system having an optical axis and comprising a first electromagnetic lens situated adjacent the first surface of the specimen, the first electromagnetic lens producing a magnetic flux;
   (b) magnetic-field-forming means for forming a magnetic field having a magnetic flux that extends from the location radially outward relative to the optical axis; and
   (c) a secondary-electron collector or detector situated so as to collect or detect, respectively, secondary electrons propagating along the radially outward extending magnetic flux.

2. The apparatus of claim 1, wherein the first electromagnetic lens is radially symmetrical about the optical axis.

3. The apparatus of claim 2, wherein:
   the optical axis is perpendicular to the first surface of the specimen at the location; and
   the charged-particle beam is directed along the optical axis to the first surface.

4. The apparatus of claim 2, wherein the first electromagnetic lens is conical, having an apex oriented toward the specimen.

5. The apparatus of claim 1, wherein the first electromagnetic lens is an objective lens.

6. The apparatus of claim 5, wherein:
   the objective lens is cylindrical and is symmetrical about the optical axis, the objective lens having a bore diameter D and comprising a magnetic pole having an inside surface; and said magnetic-field-forming means comprises a spacing L between the inside surface of the magnetic pole of the objective lens and the first surface of the specimen, wherein L>D.

7. The apparatus of claim 1, further comprising a condenser lens situated upstream of the objective lens.

8. The apparatus of claim 1, wherein the first electromagnetic lens has an outer diameter and the SE collector or detector is situated farther from the optical axis than the outer diameter of the first electromagnetic lens.

9. The apparatus of claim 1, further comprising an actuator for moving said magnetic-field-forming means axially relative to the specimen.

10. The apparatus of claim 1, wherein said magnetic-field-forming means comprises a second electromagnetic lens.

11. The apparatus of claim 10, further comprising a controller connected to the second electromagnetic lens to adjust an amount of electrical energy supplied to the second electromagnetic lens.

12. The apparatus of claim 1, wherein the first electromagnetic lens is a condenser lens.

13. The apparatus of claim 12, wherein the condenser lens is radially symmetrical about the optical axis.

14. The apparatus of claim 1, wherein the secondary-electron collector or detector is positively biased.

15. The apparatus of claim 14, wherein said magnetic-field-forming means comprises a conical electromagnetic lens having an apex oriented toward the specimen.

16. The apparatus of claim 15, further comprising a specimen stage pivotable about an axis that is perpendicular to the optical axis.

17. The apparatus of claim 1, further comprising a deflector for deflecting the charged-particle beam in directions perpendicular to the optical axis so as to scan the charged-particle beam over a region of the first surface of the specimen including the location.

18. The apparatus of claim 1, further comprising multiple secondary-electron collectors or detectors.

19. The apparatus of claim 18, wherein the secondary-electron collectors or detectors are situated radially with respect to the optical axis.

20. The apparatus of claim 18, further comprising multiple secondary-electron detectors, and a selector switch connected to each of the secondary-electron detectors.

21. The apparatus of claim 1, further comprising:
a secondary-electron detector;
a controller connected to the secondary-electron detector, the controller being operable to produce image-encoding signals from electrical signals received from the secondary-electron detector; and
a display connected to the controller for producing an image from the image-encoding signals received from the controller.

22. The apparatus of claim 1, wherein an axial magnetic field at the first surface has zero magnitude.

23. The apparatus of claim 22, further comprising means for moving the zero-magnitude axial magnetic field along the optical axis.

24. An apparatus for collecting or detecting secondary electrons from a specimen having first and second opposing surfaces, the apparatus comprising:
(a) a charged-particle-beam optical system situated so as to direct a charged-particle beam from a charged-particle-beam source to a location on the first surface of the specimen, the charged-particle beam having sufficient energy to produce secondary electrons when the charged-particle beam impinges on the location, the charged-particle-beam optical system having an optical axis and comprising a first electromagnetic lens producing a first magnetic field having a first magnetic flux;
(b) a second electromagnetic lens having an axis and situated adjacent the second surface of the specimen, the second electromagnetic lens producing a second magnetic field having a second magnetic flux, wherein secondary electrons produced at the location impinged by the charged-particle beam propagate radially outward along the first magnetic flux; and
(c) a secondary-electron collector or detector situated so as to collect or detect, respectively, the secondary electrons.

25. The apparatus of claim 24, wherein the second magnetic field is attractive to the first magnetic field.

26. The apparatus of claim 24, wherein the second magnetic field is repulsive to the first magnetic field so as to cause the first magnetic flux to extend radially outward from the location parallel to the first surface.

27. The apparatus of claim 24, wherein the secondary-electron collector or detector is positively biased.

28. The apparatus of claim 24, wherein the secondary-electron collector or detector comprises a scintillator and a photomultiplier.

29. The apparatus of claim 24, further comprising:
a secondary-electron detector;
a processor connected to the secondary-electron detector, the processor being operable to produce image-encoding signals from electrical signals received from the secondary-electron detector; and
a display connected to the processor for producing an image from the image-encoding signals received from the processor.

30. An apparatus for scanning a specimen with a charged-particle beam to produce and display and image of the specimen, the apparatus comprising:
(a) a charged-particle beam source that generates a charged-particle beam;
(b) an electromagnetic lens situated so as to direct the charged-particle beam onto a location on a surface of the specimen, the electromagnetic lens having an optical axis extending through the location;
(c) a scanner situated so as to scan the charged-particle beam, directed by the electromagnetic lens, over a region of the surface including the location;
(d) a secondary-electron detector situated so as to detect secondary electrons generated by impingement of the charged-particle beam at the location;
(e) a processor connected to the secondary-electron detector so as to receive electrical signals from the secondary-electron detector and generate image-forming signals;
(f) a display connected to the processor, the display being operable to form an observable image of the region based on the image-forming signals; and
(g) means for generating a magnetic field having a magnetic flux extending radially outward from the location and parallel to the surface of the specimen, the magnetic field extending into a region, axially adjacent the location, in which the magnetic field has zero magnitude.

31. A scanning-type apparatus for producing an image of a surface of a specimen using a charged-particle beam, the apparatus comprising:

(a) a charged-particle-beam source for generating a charged-particle beam and directing the charged-particle beam along an optical axis;

(b) a first electromagnetic lens situated so as to focus the charged-particle beam at a location on a first surface of the specimen, the first electromagnetic lens being situated along the optical axis adjacent the first surface and producing a first magnetic field;

(c) a scanner situated so as to scan the charged-particle beam across a region of the first surface including the location;

(d) a secondary-electron collector or detector situated so as to collect or detect, respectively, secondary electrons generated by interaction of the charged-particle beam with the region scanned by the charged-particle beam;

(e) a display connected to the secondary-electron collector or detector for forming an observable image of the region of the specimen based on electrical signals by the secondary-electron collector or detector collecting or detecting, respectively, the secondary electrons; and (f) a second electromagnetic lens that is situated adjacent to the second surface of the specimen opposite the first surface, that produces a second magnetic field, and that interacts with the first magnetic field to produce (i) a magnetic flux causing secondary electrons to propagate from said region to the secondary-electron collector or detector, and (ii) an axial magnetic field having zero magnitude at the first surface.

32. The apparatus of claim 31, further comprising multiple secondary-electron collectors or detectors situated radially, with respect to the optical axis, along the magnetic flux.

33. The apparatus of claim 32, further comprising multiple secondary-electron detectors, and a selector switch connected to the secondary-electron detectors for selecting a signal from any of the secondary-electron detectors for routing to the display.

34. The apparatus of claim 32, wherein the number of secondary-electron collectors or detectors situated radially with respect to the optical axis is even.

35. A method for detecting a mark on an exposed surface in an electron-beam exposure apparatus, the method comprising:

(a) propagating an electron beam along an optical axis and subjecting the electron beam to an accelerating potential of 50 kV or greater;

(b) scanning the mark with the electron beam to cause scatter of electrons from the mark and to generate secondary electrons propagating from the mark;

(c) magnetically urging the secondary electrons to propagate away from the optical axis;

(d) collecting or detecting the secondary electrons and producing a corresponding electronic signal; and (e) decoding the electronic signal to produce data concerning a characteristic of the mark.

36. The method of claim 35, wherein the data encodes an image of the mark.

37. An electron-beam exposure apparatus, comprising:

(a) an electron-beam source for generating an electron beam having an energy of at least 50 kV, and for directing the electron beam along an optical axis;

(b) a projection lens situated so as to produce a first magnetic field and to project the electron beam onto a region of a first surface of a specimen placed adjacent the projection lens such that the optical axis passes through the first surface;

(c) a scanner situated so as to scan the electron beam so as to cause the electron beam to scan the region and produce scattered electrons;

(d) a secondary-electron collector or detector situated so as to collect or detect, respectively, secondary electrons generated by interaction of the scattered electrons with the region; and (e) a magnetic-field source situated so as to produce a second magnetic field.

38. The apparatus of claim 37, further comprising an even number of secondary-electron collectors or detectors placed in axially symmetrical locations relative to the optical axis.

39. The apparatus of claim 37, wherein the second magnetic field interacts with the first magnetic field to produce an axial magnetic field having zero magnitude, the axial magnetic field being situated at an axial region of the first surface.

40. A secondary-electron collecting or detecting device, comprising:

(a) a charged-particle-beam optical system situated so as to receive a charged-particle beam, propagating along an optical axis, and direct the charged-particle beam to a location on a specimen;

(b) a secondary-electron collector or detector for collecting or detecting, respectively, secondary electrons emitted from the location on the specimen as a result of impingement of the charged-particle beam on the location, the secondary-electron collector or detector being positively biased to facilitate attraction of secondary electrons to the secondary-electron collector or detector; and (c) means for forming a magnetic field having a magnetic flux that extends from the optical axis radially outward and that guides the secondary electrons toward the secondary-electron collector or detector.

41. A mark-detecting device that collects or detects secondary electrons emitted from a first surface of a specimen when a mark on the surface is struck by a charged-particle beam, the device comprising;

(a) a charged-particle-beam source that produces a charged-particle beam and directs the beam along an optical axis onto the mark on the first surface;

(b) a scanner situated so as to scan the charged-particle beam over the mark;

(c) a secondary-electron detector situated so as to detect secondary electrons produced by impingement of the charged-particle beam on the mark, the secondary-electron detector being situated at a location that is laterally displaced from the optical axis and being positively biased so as to facilitate attraction of secondary electrons;

(d) means for forming a magnetic field relative to the optical axis, the magnetic field having a magnetic flux serving to guide secondary electrons from the mark to the secondary-electron detector; and (e) a processor connected to the secondary-electron detector, the processor being operable to calculate at least one parameter selected from a group consisting of mark position, mark resolution, and field distortion from electrical signals received from the secondary-electron detector.

42. The apparatus of claim 41, wherein the charged-particle beam impinges on the mark perpendicular to the first surface, and the secondary-electron detector is situated remotely from the optical axis.

43. The apparatus of claim 41, further comprising:

an objective lens situated on the optical axis such that the charged-particle beam passes through the objective lens, the objective lens being situated so as to be adjacent the first surface whenever the specimen is positioned to allow the charged-particle beam to impinge on the mark; and multiple secondary-electron detectors situated peripherally relative to the objective lens.

44. The apparatus of claim 43, wherein said means for forming a magnetic field forms the magnetic field such that the respective magnetic flux extends radially outward from the optical axis parallel to the first surface, the magnetic flux serving to guide secondary electrons to the secondary-electron detectors.

45. The apparatus of claim 44, wherein an axial magnetic field on the first surface has zero magnitude.

46. The apparatus of claim 41, wherein an axial magnetic field on the first surface has zero magnitude.

47. The apparatus of claim 46, further comprising means for forming the axial magnetic field on the first surface having zero magnitude.

48. The apparatus of claim 41, further comprising means for forming the axial magnetic field on the first surface having zero magnitude.

49. The apparatus of claim 41, further comprising:

an objective lens situate on the optical axis such that the charged-particle beam passes through the objective lens, the objective lens being situated so as to be adjacent the first surface whenever the specimen is positioned to allow the charged-particle beam to impinge upon the mark, and the objective lens producing a magnetic field; and multiple secondary-electron collectors or detectors situated peripherally relative to the objective lens, wherein said means for forming a magnetic field comprises a magnet situated adjacent a second surface of the specimen opposite the first surface, the magnet producing a magnetic field that interacts with the magnetic field produced by the objective lens to generate the magnetic flux.

50. The apparatus of claim 49, wherein the magnetic flux extends radially outward from the optical axis parallel to the first surface.

51. The apparatus of claim 49, wherein interaction of the first and second magnetic fields produces an axial magnetic field, at the first surface, having zero magnitude.

52. The apparatus of claim 41, wherein the charged-particle beam is an electron beam.

53. The apparatus of claim 49, wherein the electron beam incident on the mark has an energy of at least 50 keV.

54. The apparatus of claim 53, further comprising multiple secondary-electron collectors or detectors individually located at positions that are radially symmetrical relative to the optical axis, wherein the electron beam propagates along the optical axis, and each of the secondary-electron collectors or detectors produces an electrical field that collectively form an electrical field, in the vicinity of the electron beam, that is symmetrical about the optical axis.

55. An electron-beam exposure apparatus, comprising:

(a) an electron-beam source generating an electron beam having an energy of at least 50 keV;

(b) a projection lens situated relative to an optical axis so as to project the electron beam onto a mark on a surface of a specimen, the mark comprising a material that scatters electrons and generates secondary electrons whenever the mark is struck by the electron beam, the projection lens having a magnetic pole oriented toward the specimen and comprising an inside surface, the magnetic pole having a diameter D extending across the optical axis;

(c) a scanner situated so as to scan the electron beam over the mark;

(d) a secondary-electron collector or detector situated so as to collect or detect, respectively, scattered electrons and secondary electrons generated by impingement of the electron beam on the mark; and (e) the projection lens being situated such that the inside surface of the magnetic pole is a distance L, parallel to the optical axis, from the surface of the specimen, wherein L>D.

* * * * *

UNITED STATES PATENT AND TRADEMARK OFFICE
CERTIFICATE OF CORRECTION

PATENT NO. : 5,981,947

DATED : November 9, 1999

INVENTOR(S) : Nakasuji et al.

It is certified that error appears in the above-identified patent and that said Letters Patent is hereby corrected as shown below:

On the cover page, the following foreign application priority data should be added:

-- [30]  Foreign Application Priority Data

February 3, 1997 [JP] Japan ......... 9-020308
    June 30, 1997   [JP] Japan ......... 9-187204 --

Signed and Sealed this

Twenty-second Day of May, 2001

Attest:

NICHOLAS P. GODICI

*Attesting Officer*       *Acting Director of the United States Patent and Trademark Office*